United States Patent [19]
Holland et al.

[11] Patent Number: 5,170,123
[45] Date of Patent: Dec. 8, 1992

[54] MAGNETIC RESONANCE IMAGER WITH DIGITAL TRANSMITTER/RECEIVER

[75] Inventors: G. Neil Holland, Chagrin Falls; Douglas M. Blakeley, Euclid; John R. Stauber; David C. Flugan, both of Cleveland; Kenneth S. Denison, Shaker Hts., all of Ohio

[73] Assignee: Picker International, Inc., Highland Heights, Ohio

[21] Appl. No.: 392,649

[22] Filed: Aug. 11, 1989

[51] Int. Cl.$^5$ .......................................... G01R 33/20
[52] U.S. Cl. .................................. 324/322; 324/307; 364/413.13
[58] Field of Search ............... 324/307, 309, 314, 318, 324/322; 128/653 SC; 364/413.13, 413.01

[56] References Cited
U.S. PATENT DOCUMENTS

| | | | |
|---|---|---|---|
| 4,694,254 | 9/1987 | Vatis et al. | 324/314 |
| 4,740,744 | 4/1988 | Lubarsky et al. | 324/78 D |
| 4,777,438 | 10/1988 | Holland | 324/309 |
| 4,879,514 | 11/1989 | Mehlkopf et al. | 324/309 |
| 4,992,736 | 2/1991 | Stortmont et al. | 324/309 |
| 5,004,983 | 4/1991 | Proska et al. | 324/322 |

FOREIGN PATENT DOCUMENTS 0292064 11/1988 European Pat. Off. .
WO87/06712 11/1987 PCT Int'l Appl. .

OTHER PUBLICATIONS

PTS 160 System Section, Programmed Test Sources, Inc. Littleton, Mass. pp. cover-28 (1980).
"A Fully Digital Spectrometer for Low Field MR Imaging Systems"; SMRA Book of Abstracts, R. Proska, vol. 1, Aug. 20, 1988.
William E. Sabin, et al., "Digital Signal Processing", 1987, pp. 247-291, Single-Sideband Systems and Circuits.
"Data Sheet DRFS-2250, DRFS-3250 Number Controlled Modulated Oscillator", Advertising Brochure of Digital RF.
"IMS A100 IMS A100M Cascadable Signal Processor", Advertising Brochure of INMOS, Feb. 1989.
"Advanced Information Cascadable-Adaptive Finite-Impulse-Response (CAFIR) Digital-Filter Chip", Advertising Brochure of Motorola Semiconductor Technical Data, 1988, pp. 1-9.
"Advance Information 56-Bit General Purpose Digital Signal Processor", Advertising Brochure of Motorola Semiconductor Technical Data, 1988, pp. 1-8.
"Digital Signal Processing Software Package", Advertising Brochure of Burr-Brown Corporation, 1987, pp. 1-4.
"Filter Design and Analysis Systems", Advertising Brochure of Momentum Data Systems Inc.

Primary Examiner—Louis Arana
Attorney, Agent, or Firm—Fay, Sharpe, Beall, Fagan, Minnich & McKee

[57] ABSTRACT

A magnetic resonance imaging apparatus includes one or more digital transmitters (B), one or more digital receivers (C), and digital data processing circuitry (D) which are all clocked and controlled by a single clock (F). Each digital transmitter includes a numerically controlled modulated oscillator (20) which processes digital phase and frequency signals to produce an output which addresses a wave-form map stored in a PROM (22). Each wave-form output of the PROM is multiplied (24) by a digital amplitude profile signal to generate a phase, frequency, and amplitude modulated digital RF signals. A clock gate (30) controls clocking of the digital modulation to create RF pulses. A digital-to-analog converter (28) converts the digital information to an analog RF pulse which is applied to a subject in an image region. The receivers each include an analog-to-digital converter (60) which digitizes the magnetic resonance signal emanating from the subject in the image region with four fold oversampling. A pair of FIR filters (62a, 62b) multiply the digital resonance signal by digital sine and cosine filter coefficients to create in-phase and out-of-phase digital magnetic resonance signal components. After additional digital filtering (64a, 64b), the digital in-phase and quadrature components are Fourier transformed (70) and accumulated in an image memory (72) to form an image representation.

23 Claims, 4 Drawing Sheets

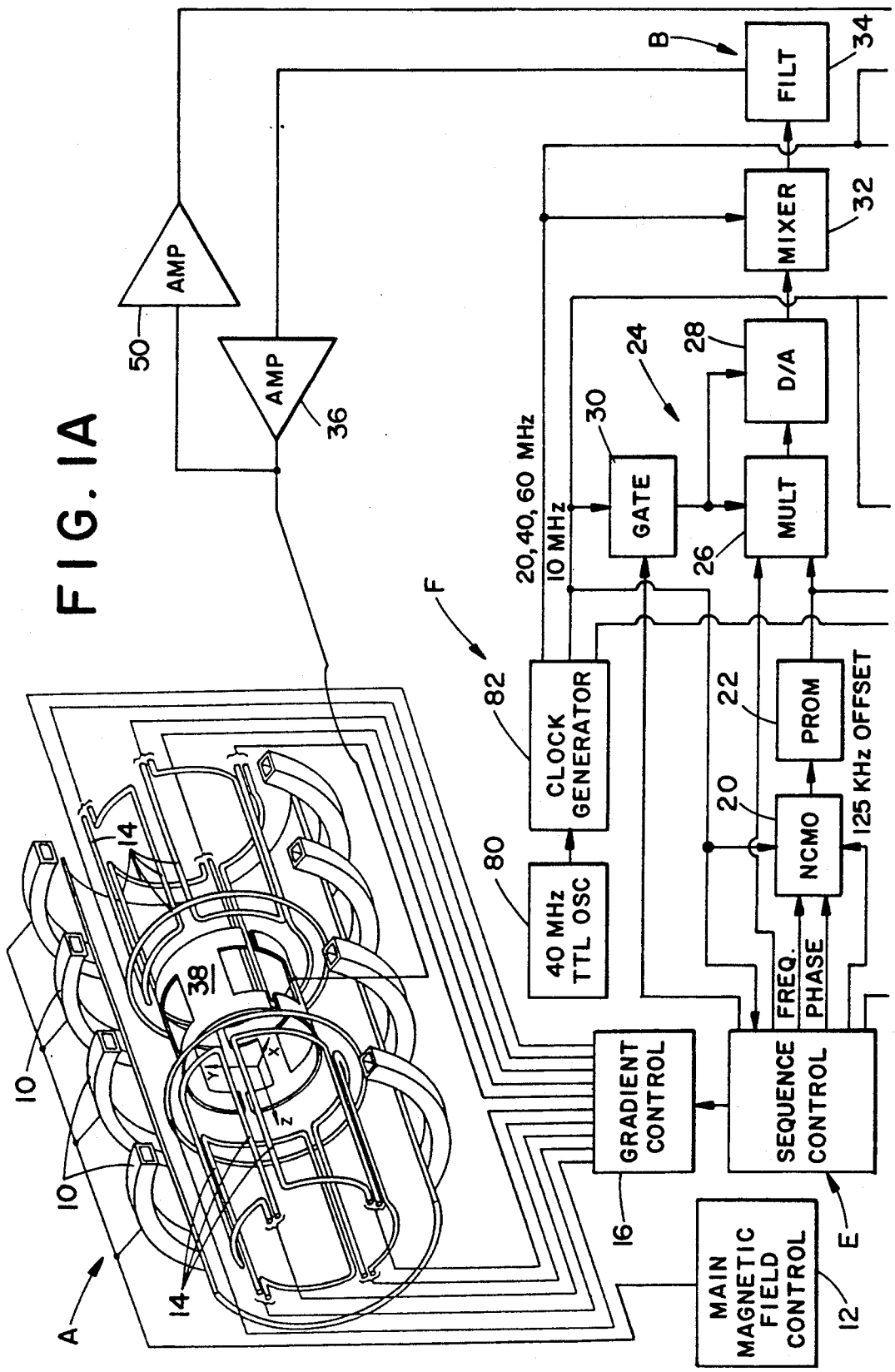

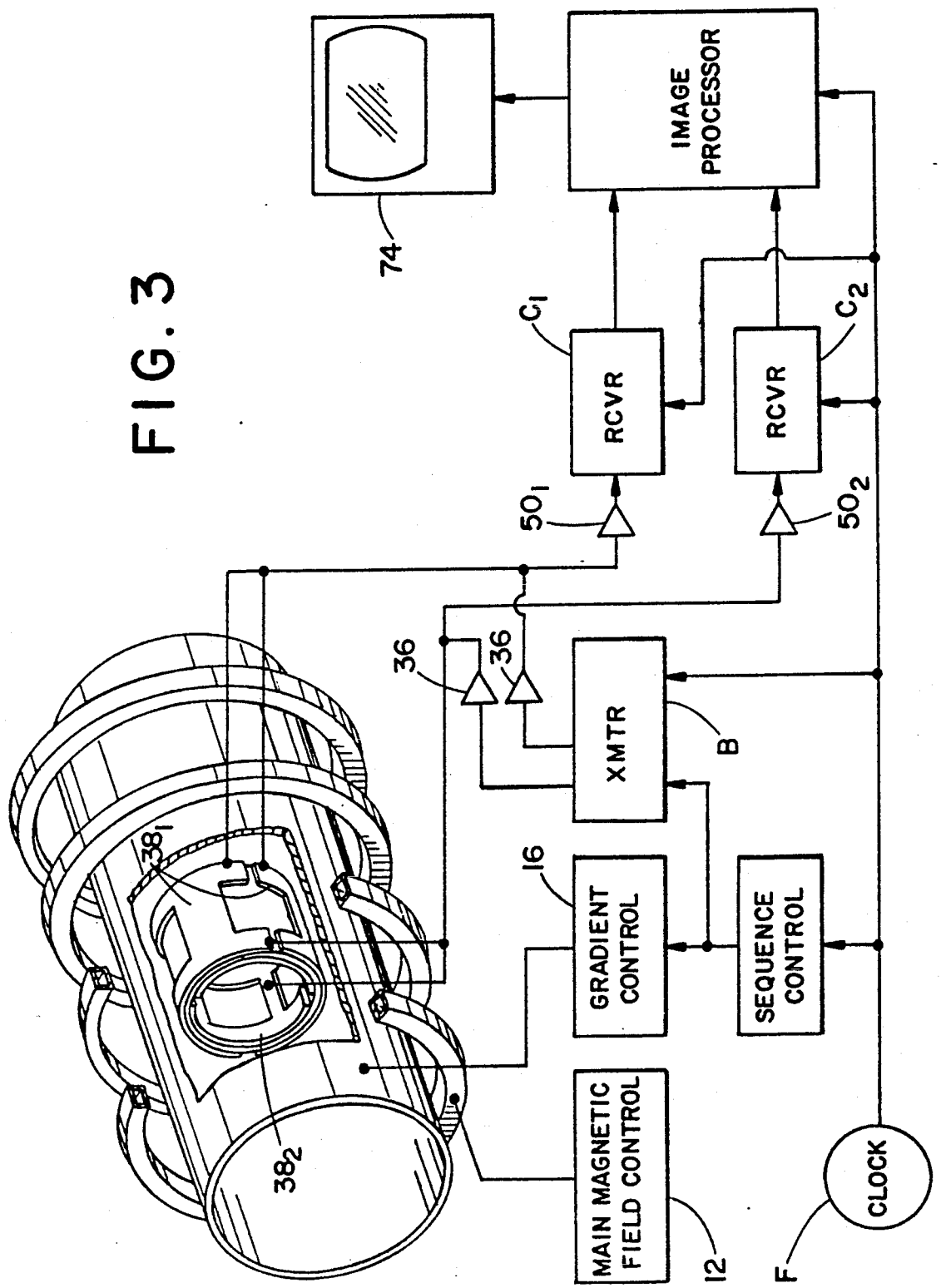

MAGNETIC RESONANCE IMAGER WITH DIGITAL TRANSMITTER/RECEIVER

BACKGROUND OF THE INVENTION

The present invention relates to the magnetic resonance arts. It finds particular application in conjunction with whole body magnetic resonance imaging systems and will be described with particular reference thereto. However, it is to be appreciated that the invention may also find application in conjunction with small bore imaging systems, magnetic resonance spectroscopy systems, and the like.

Heretofore, medical magnetic resonance imaging systems have utilized analog transmitters and receivers. The transmitters commonly generated a radio frequency signal at the Larmor frequency of dipoles of interest in the imaging region. The radio frequency signal was shaped into pulses with selected frequency, phase, and amplitude characteristics and sent by way of a power amplifier to radio frequency transmitter coils. The pulse of frequency, phase, and amplitude modulation were effected with analog components.

Frequency modulation was accomplished with a frequency synthesizer which generated an analog signal of selectable frequency. Although some frequency synthesizers had digital sections, the resultant frequency signal was analog. Pulse amplitude modulation was commonly conducted with double balanced mixers and analog gates or switches.

Similarly phase modulation was achieved by phase shifting an intermediate radio frequency through the use of a phase splitter and combining it with an appropriate frequency to achieve the required Larmor frequency again through the use of a double balanced mixer. The use of these devices presented problems that double balanced mixers are inherently non-linear, e.g. square law devices, phase splitters had a wide error margin and analog gates tended to have leakage introducing unwanted characteristics in the transmitted radio frequency pulse. In order to operate the double balanced mixer in the most linear portion of its operating curve it was necessary to add external components to bias the input appropriately. Since the bias point could vary from unit to unit it was necessary to incorporate adjustable components. Similar methods were required to calibrate phase splitting devices and reduce leakage in analog gates. These adjustments not only increased the cost and complexity of the hardware and initial calibration, but also provided numerous unauthorized adjustment points.

The analog magnetic resonance signals emanating from the subject were received and demodulated by an analog based receiver. Analog phase sensitive detectors produced sine and cosine related channels of analog signals. The sine and cosine analog signals were separately digitized and digitally processed to perform fast Fourier transform and other digital processing operations to create an image representation.

Analog receivers were, again, non-linear and suffered the above described problems of non-linear components. Signals which bled through the analog components or devices became artifacts in the resultant image. The variations from device to device were more critical in the receiver. Failure to maintain channel to channel balance, amplitude, and phase consistency in the sine and cosine or real and imaginary channels also resulted in image artifacts. The analog receivers were further subject to DC level errors. Typically, twenty to thirty seconds were required before each scan in order to determine the actual, current DC level so that appropriate compensation could be made.

The present invention contemplates a new and improved magnetic resonance system which overcomes the above referenced problems and others.

SUMMARY OF THE INVENTION

In accordance with the present invention, a magnetic resonance imaging system is provided which includes a digital transmitter and a digital receiver.

In accordance with one more limited aspect of the present invention, a common clock generator controls the sequence controller, the digital transmitter, the digital receiver, and the digital processing controller. This provides for consistent and repeatable operation of these devices in the time domain.

In accordance with another aspect of the present invention, the digital transmitter includes a digital frequency synthesizer which performs frequency and phase modulation and a digital multiplier means which performs amplitude modulation by multiplying the digital values.

In accordance with another aspect of the present invention, there is a complete digital integration of the scan sequence functions.

In accordance with another aspect of the present invention, the received digital magnetic resonance signal is over sampled by a factor of 4 or multiples thereof. Because a sine can be defined by four points, specifically 0, +1, 0, −1, (and cosine can similarly be defined by four points, +1, 0, −1, 0). The four fold oversampling enables the digital resonance signal to be sine and cosine modulated by simply rebinning, negation, and zero filling operations.

One advantage of the present invention is that it improves image quality and eliminates artifacts.

Another advantage of the present invention is that it reduces component cost.

Another advantage of the present invention is &:hat it functions in real time without batch processing.

Further advantages include simplified calibration and the elimination of service technician accessible adjustments.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts or in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1B:
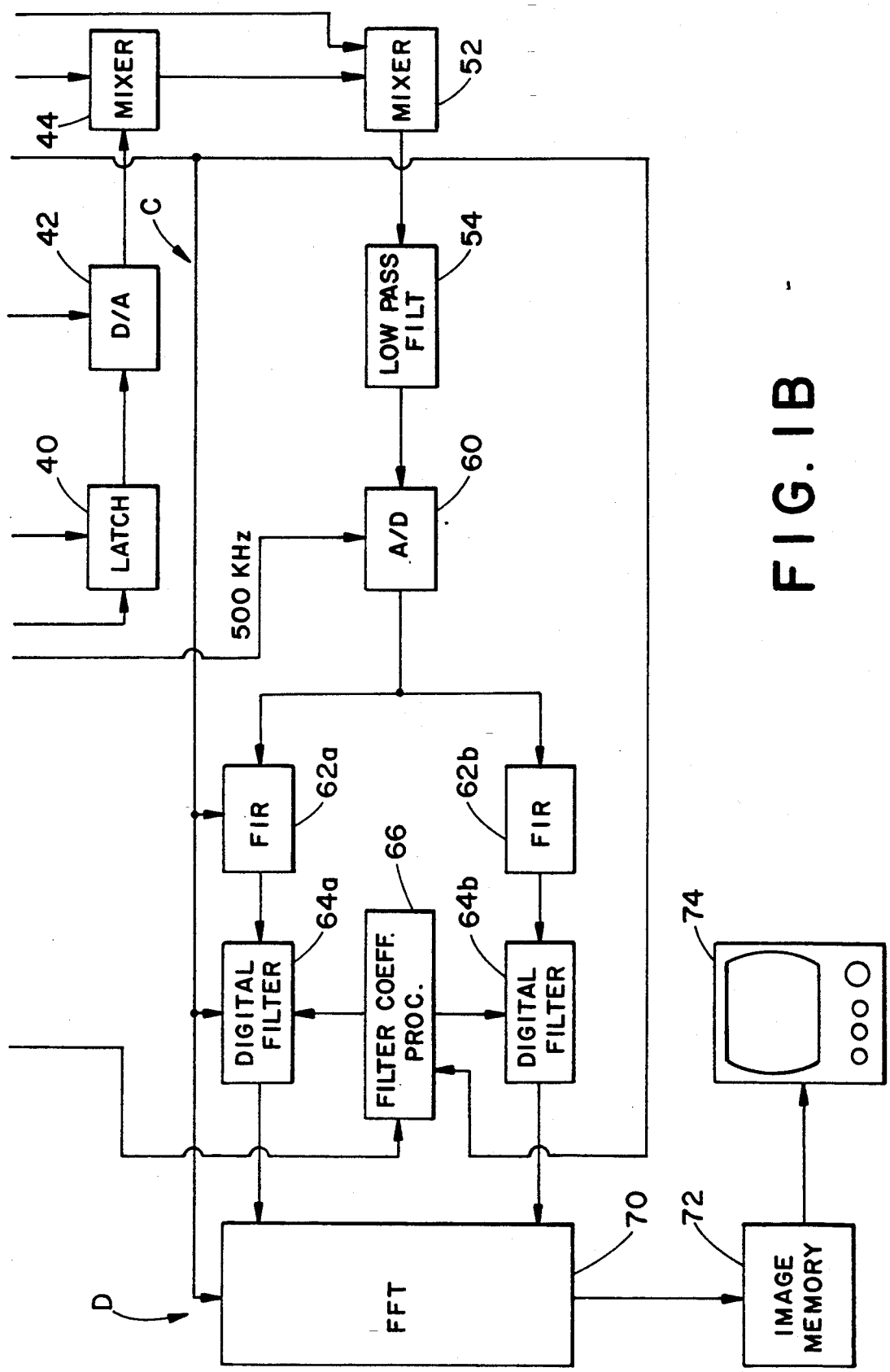
FIG. 1 is a diagrammatic illustration of a magnetic resonance imaging apparatus in accordance with the present invention.

The magnetic field means A creates magnetic fields and magnetic field gradients through a subject in an examination region. A digital transmitter B receives digital frequency and phase control words, digitally processes the digital words, and transmits a corresponding radio frequency signal into the examination region. Analog radio frequency magnetic resonance signals emanating from the image region are digitized, demodulated, and divided into sine and cosine components digitally by a digital receiver C. Digital processing circuitry D digitally Fourier transforms and otherwise processes the digital magnetic resonance data from the receiver into an image representation. A sequence controller E sends the control words and other control signals to the digital transmitter, receiver, and processing circuitry to implement a selected one of a plurality of magnetic resonance imaging sequences. A common clock F synchronously clocks the sequence controller E, the transmitter B, the receiver C, and the image processing circuitry D.

The magnetic field means A includes a plurality of resistance or superconducting magnets 10 which are controlled by a main magnetic field control means 12 to produce a generally uniform, static magnetic field through the examination region, commonly a 0.5, 1.0, or 1.5 Tesla field. A plurality of magnetic field gradient coils 14 are operated under the control of a gradient field coil controller 16 for selectively creating gradients across the main magnetic field. Preferably, gradients of selectable slope are selectively created along three mutually orthogonal axes, for convenience denoted as x, y, and z axes.

The digital transmitter B includes a digital synthesizer chip 20 which has input registers for receiving (i) a digital frequency control or selection word or signal, (ii) a digital phase selection or control word signal, (iii) a digital offset or carrier frequency word or signal that identifies the carrier frequency, and (iv) a clock signal, e.g. 10 MHz. In the preferred embodiment, the synthesizer chip 20 is a numerically controlled modulated oscillator, NCMO. The output phase and frequency of the numerically controlled modulated oscillator is determined by the clock frequency, the frequency control word, the phase control word, and the offset frequency word received from the sequence controller E.

The numerically controlled modulated oscillator output addresses a wave-form map stored in a programmable read only memory (PROM) 22 to translate sine wave phases to a corresponding amplitude. Optionally, the PROM may store a plurality of wave-forms, as may be appropriate to different imaging sequence one of which is selected by the sequence controller E. A digital modulating means 24 numerically modulates at least one of the amplitude, phase, and frequency of the transmitted radio frequency signal. The modulating means includes an amplitude modulation means 26 which multiplies the wave-form from the wave-form map by a digital amplitude profile word or signal from the sequence controller to form a pulse profile that digitally describes a selected pulse. In the preferred embodiment, the amplitude modulation means is a digital multiplier which multiplies each output point from the wave-form map by the digital values of the amplitude profile word. The multiplier 26 is clocked at the same speed as the numerically controlled modulated oscillator, such that each wave-form point is multiplied once by a corresponding amplitude profile value. Because the amplitude modulation is achieved numerically, the resultant digital pulse profile is highly linear and has substantially no carrier feed through.

A first digital-to-analog converter 28 converts the digital pulse profile to a corresponding analog pulse profile. A clock signal interrupting means 30 selectively passes and blocks the clock signals from the digital modulating circuits to form pulses in the radio frequency signal. A mixer 32 mixes the analog transmitter pulse profile with an appropriate mixing frequency to produce the Larmor frequency for the selected nuclei. In the preferred embodiment, the selected nuclei are protons which have Larmor frequencies of 21.3, 42.6, and 63.9 MHz at magnetic fields of 0.5, 1.0, and 1.5 T, respectively. An analog band-pass filter 34 removes off frequency noise before the signal is amplified by a power amplifier 36. The amplified transmitter RF signal is applied to a radio frequency antenna 38 which broadcasts radio frequency energy of the corresponding phase, frequency, and amplitude into the examination region in order to induce magnetic resonance or manipulate resonating nuclei of the subject.

On each cycle of the 10 MHz clock, data is transferred or pipelined between the stages. A latch 40 is clocked to receive and hold each digital wave-form word from the wave-form map to insert one clock cycle delay prior to converting from digital to analog by a digital-to-analog converter 42. This maintains a constant phase relationship between the two digital-to-analog converters. A mixer 44 mixes the analog wave-form with a carrier frequency. This generates an analog reference signal of the same frequency and phase as the transmitter pulses.

During the receive cycle, the base operating frequency of the NCMO 20 is lowered by 125 kHz. The analog magnetic resonance signal emanating from the subject in the examination region is picked up by the antenna 38 or a surface coil (not shown). The analog NMR signal is amplified by an amplifier 50 and down converted to a frequency centered around 125 kHz by an analog mixer 52. A low-pass filter 54 eliminates frequency components that are outside of the bandwidth of the receiver.

An analog-to-digital converter 60 digitizes the filtered NMR signal at a sampling rate or frequency selected in accordance with the down stream processing. The sampling theorem limits the highest carrier frequency that can be demodulated to one half of a fixed sampling frequency. The analog-to-digital converter is clocked to produce a four fold oversampling, i.e. four times the carrier rate. In the preferred embodiment, the sampling rate is 500 kHz which demodulates carrier frequencies into 125 kHz to produce a maximum bandwidth of 250 kHz.

Demodulating the carrier is achieved by multiplying the received signal with in-phase (cosine) and out-of-phase (sine) components of the carrier rate. More specifically, the digital NMR signal is conveyed to a pair of data signal processing chips 62a, 62b which operate as a finite impulse response (FIR) digital filter. The FIR filter performs a quadrature baseband demodulation and low-pass filtering in a single operation. Specifically, the FIR filter coefficients are multiplied by the sine and cosine of the demodulation frequency. Because the carrier is one fourth of the sampling frequency, the sine and cosine can be defined by four symmetric points, e.g.

the 0, +1, 0, −1 points. This enables the FIR filter to use only rebinning, negation, and zero filling operations to multiply the sine and cosine. For a 125 kHz carrier and 500 kHz base sampling, the demodulated signal is formed from the digitized signal, S, as follows:

| Time (usec) | Carrier Components | | Demodulated Signal | |
|---|---|---|---|---|
| | In Phase | Out of Phase | Real | Imaginary |
| 2 | +1 | 0 | S | 0 |
| 4 | 0 | +1 | 0 | S |
| 6 | −1 | 0 | −S | 0 |
| 8 | 0 | −1 | 0 | −S |
| 10 | +1 | 0 | S | 0 |
| 12 | 0 | +1 | 0 | S |
| 14 | −1 | 0 | −S | 0 |
| 16 | 0 | −1 | 0 | S |
| . | . | . | . | . |
| . | . | . | . | . |
| . | . | . | . | . |

After the demodulation operation the resultant data may be decimated to achieve varying NMR sampling rates. With a fixed base sampling rate, the NMR rate is restricted to integer multiples of this rate. In the above example, NMR sampling is restricted to 4, 6, 8, 10, 12, . . . μsec (or equivalently 250, 167, 125, 100, 83, . . . kHz).

This gives signal in-phase data from one of the digital signal processing chips and quadrature or out-of-phase components from the other digital signal processing chip, both of which are centered around DC. In this manner, the equivalent of an analog phase sensitive detection is performed digitally. However, the digital operations are more precise over the entire imaging bandwidth and require no adjustment or DC offset correction. Because the signal was centered at 125 kHz, low frequency analog noise, which in an analog system would manifest itself as a DC artifact, is now outside of the bandwidth. Hence, no DC correction is required.

A pair of digital filters 64a, 64b perform a second stage of digital filtering on the quadrature channels. The pair of digital filters use digital signal processing devices that provide variable sampling rates and function as the digital equivalent of a programmable analog anti-alias filter. More specifically to the preferred embodiment, each filter includes a second FIR filter each with 24 bit coefficients to operate at the selected data processing rate, e.g. 125 kHz. Each FIR filter rejects frequencies outside of the bandwidth set by the sampling rate with a digital equivalent of a low-pass filter and has the form:

$$O(i) = \sum_{j=0}^{n-1} a(j) S(i - j)$$

where:
O(i)=the output signal value at time (i−1)*dt
S(i)=the input signal value at time (i−1)*dt
a(j)=the jth filter coefficient
n=the total number of filter coefficients (also called "taps")
dt=time between sampling points.

The number of filter coefficients a(j) depends on the required filter properties: passband frequency, stopband frequency, baseband ripple, stopband attenuation. In general, as the passband is narrowed, the number of coefficients increases. The computational load need not increase because the multiplication/accumulations need only be done at the output, (i.e. the NMR sampling rate, rather than the input sampling rate).

The variable sampling rate is chosen by decimation at the output of the filters. The bandwidth is inherently matched to the sampling rate. Different filter coefficients are loaded if the sampling rate or bandwidth is changed. A digital signal processor 66 provides the same coefficient a(j) and signal loading to the FIR filters 64a, 64b to assure that the same filtering is performed on each channel.

The digital processing means D includes a digital fast Fourier transform means 70 which performs an on the fly transform of each sampled line of data or view. The Fourier transformed views are further processed, as is known in the art, and accumulated in an image memory 72 to form an image representation. The image representation in the image memory may be displayed on a video monitor 74, stored on tape or disk, subject to further processing, or the like.

The common clock F includes a high stability TTL oscillator, e.g. a 40 MHz oscillator 80. A clock generator 82 divides the frequency by two, four, and by 80 to produce the 20 MHz, 10 MHz, and 500 kHz clocking signals.

Figure 2:
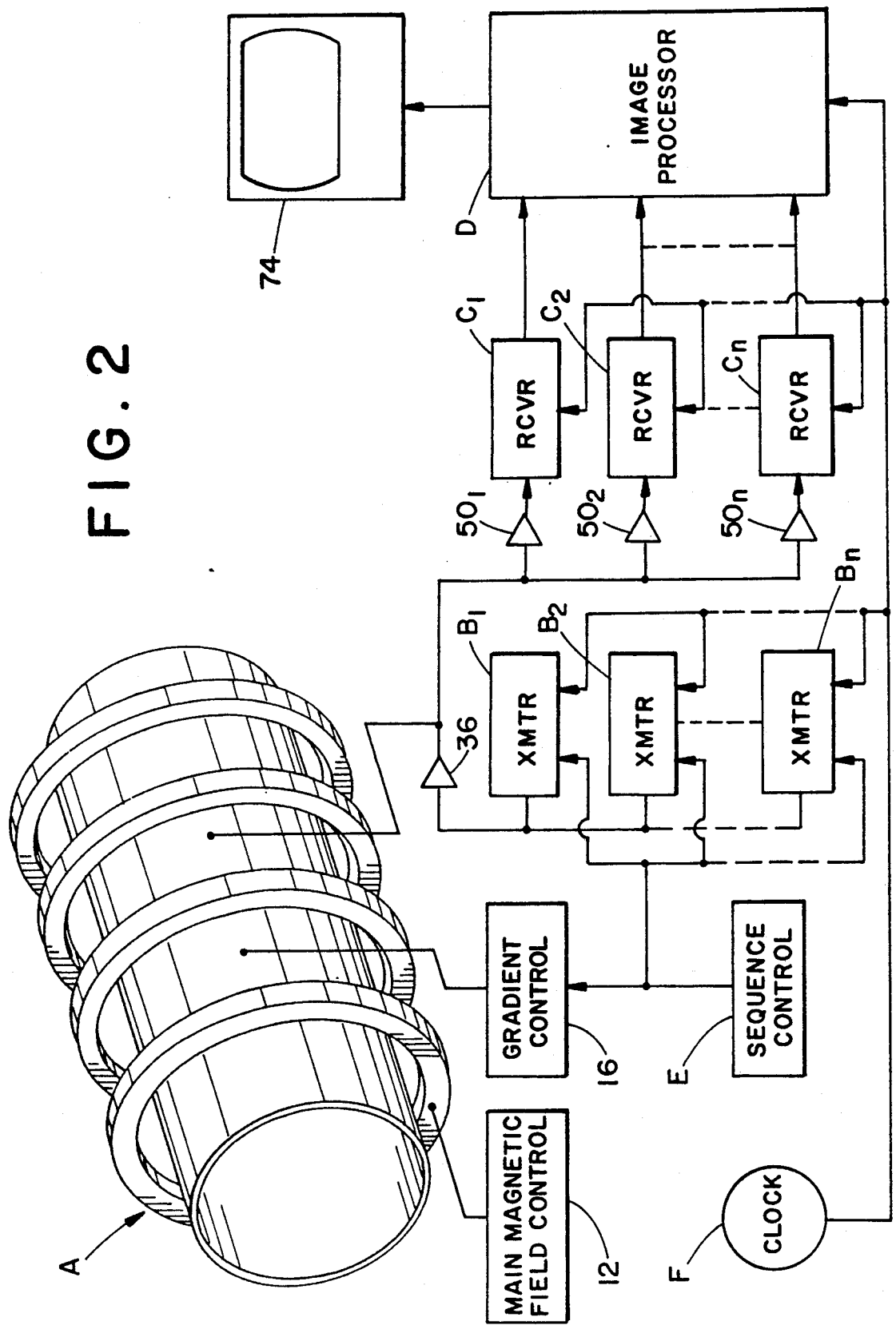
FIG. 2 is a diagrammatic illustration of an embodiment for concurrently imaging multiple nuclei; and, FIG. 3 is a diagrammatic illustration of an embodiment for digital quadrature detection.

With reference to FIG. 2, a plurality of nuclei can be imaged concurrently. A plurality of digital transmitters $B_1, B_2, \ldots B_n$ are provided for exciting magnetic resonance in each of the plurality of nuclei. A corresponding plurality of digital receivers $C_1, C_2, \ldots C_n$ are provided for receiving and demodulating signals in accordance with the resonance frequency of each of the plurality of nuclei.

By way of example, protons or hydrogen molecules have a resonance frequency at 63.9 MHz in a 1.5 T field and phosphorous has a resonance frequency of 26 MHz. The transmitter $B_1$ provides an output for exciting resonance and the protons and transmitter $B_2$ provides an output for exciting resonance in the phosphors. The two transmitters are operated under the control of the sequence controller E and the clock F such that each provides an output for exciting resonance in its corresponding nuclei simultaneously. The output resonance excitation signals are combined or summed and are amplified by the power amplifier 36 before being fed to the resonator 38. On the receiver side, the received resonance signal contains components at two Larmor frequencies. The signal is split in two and fed to receivers $C_1$ and $C_2$ for demodulation at the frequency corresponding to the phosphorous and hydrogen, respectively. The outputs of the two receivers are processed separately by the imaging processing circuitry D to generate separate digital representations of the baseband demodulated signals. The resultant images may be displayed on the video monitor 74 either side by side, superimposed, or the like.

Rather than superimposing the resonance signals for each nuclei, the excitation and detection of each nuclei can be done in an interleaved manner in a single scan. The very high off-isolation of a digital transmitter enables the two transmitter outputs, i.e., the non-transmitting output of one and the resonance excitation output of the other, to be combined without any switching means for selecting among the transmitters. Second, the high accuracy and precision of the digital frequency generation enables the transmitters to be alternated with no, or substantially no, phase error. Such phase errors accumulate during the signal averaging process in a spectroscopic experiment. A digital transmitter's elimination of this error avoids unnecessary loss of the signal-to-noise ratio. Each of the receivers is again tuned to demodulate received signals at frequencies corresponding to a respective one of the excited nuclei.

As yet another alternative, the imaging sequences for each nuclei can be conducted sequentially.

With reference to FIG. 3, a plurality of receivers can be connected with different antennae to receive different portions of the signal from common nuclei. The coils are positioned adjacent each other, e.g., sequentially along a patient's spine. In the illustrated embodiment, two coils are positioned coaxially to form a quadrature pair. Alternately, two planar coils may form the quadrature pair. Two receivers, $C_1$ and $C_2$, are each connected with one of the two coils. The coefficients of the digital FIR filters are selected such that one is phase-shifted 90 degrees relative to the other. In this manner, the 90 degree phase shift is precisely conducted digitally rather than using passive components such as capacitors, inductors, or resistors on the coils. The digital signal combination and phase shifter is inherently more precise which leads to superior quadrature combination, hence an improved signal-to-noise ratio. Moreover, passive components are eliminated from the coils simplifying coil design and allowing high impedance circuits to be used more readily. The reduction in components on the coil also achieves a lower signal loss, less stray capacitance, and other undesirable real world phenomena.

The invention has been described with reference to the preferred embodiment. Obviously, alterations and modifications will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A magnetic resonance imaging system comprising:
    a magnetic field means for creating a main magnetic field and magnetic field gradients through an image region;
    a digital transmitter which digitally processes digital input commands to determine, digitally, characteristics of a transmitted radio frequency signal, the digital transmitter including:
        a digital memory means for storing a digital wave form description,
        a digital modulation means for digitally multiplying the digital wave form description by a digital word to form a digital pulse profile;
    a first converter means for converting the digital pulse profile into analog radio frequency pulses;
    an antenna which receives the analog radio frequency pulses and transmits corresponding radio frequency energy into the image region;
    a digital receiver for converting an analog resonance signal emanating from the image region to digital data;
    a digital image processing means for digitally processing the digital data into an image representation.

2. The system as set forth in claim 1 wherein the digital receiver includes:
    a digital demodulating means for digitally quadrature baseband demodulating the digital data.

3. The system as set forth in claim 1 wherein the digital receiver includes an analog-to-digital converter means for converting the analog resonance signals to a digital resonance signal and a pair of digital signal processors for digitally multiplying the digital resonance signal by sine and cosine filter coefficients, respectively to generate in-phase and quadrature digital magnetic resonance signal components.

4. The system as set forth in claim 1 wherein the transmitted further includes:
    a clock for clocking the digital modulation means; and,
    a means for selectively passing and blocking clock signals to the digital modulation means to form the digital pulse profiles.

5. The system as set forth in claim 1 further including a common clock generator which generates clock signals for synchronously clocking the digital transmitter, the digital receiver, and the digital image processing means.

6. A magnetic resonance imaging system comprising:
    a magnetic field means for creating a main magnetic field and magnetic field gradients through an image region;
    a digital transmitter which digitally processes digital input commands to determine digitally characteristics of a transmitted radio frequency signal;
    a first converter means for converting the digitally determined characteristics into analog radio frequency pulses;
    an antenna which receives the analog radio frequency pulses and transmits corresponding radio frequency energy into the image region;
    a digital receiver for converting an analog resonance signal emanating from the image region to digital data the digital receiver including:
        a combined digital demodulating and filtering means for digital quadrature demodulating and low-pass filtering the digital data;
    a digital image processing means for digitally processing the digital data into an image representation.

7. A magnetic resonance imaging system comprising:
    a magnetic field means for creating a main magnetic field and magnetic field gradients through an image region;
    a digital transmitter which digitally processes digital input commands for digitally determining characteristics of a transmitted radio frequency signal;
    a first converter means for converting the digitally determined characteristics into analog radio frequency pulses;
    an antenna which receives the analog radio frequency pulses and transmits corresponding radio frequency energy into the image region;
    a digital receiver for converting an analog resonance signal emanating from the image region to digital data the digital receiver including:
        a finite impulse response digital filter means for digitally multiplying the digital data with in-phase and out-of-phase components of a carrier to demodulate and filter the digital data;
    a digital image processing means for digitally processing the demodulated and filtered digital data into an image representation.

8. The system as set forth in claim 7 wherein the digital data is sampled at four times the carrier and the in-phase and out-of-phase components are sine and cosine components which take only −1, 0, and +1 values, the digital data demodulation being performed by rebinning, negation, and zero-filling.

9. A magnetic resonance imaging system comprising:
a magnetic field means for creating a main magnetic field and magnetic field gradients through an image region;
a digital transmitter which digitally processes digital input commands to determine, digitally, characteristics of a transmitted radio frequency signal;
a first converter means for converting the digitally determined characteristics into analog radio frequency pulses;
an antenna which receives the analog radio frequency pulses and transmits corresponding radio frequency energy into the image region;
a digital receiver for converting an analog resonance signal emanating from the image region to digital data, the digital receiver including:
an analog-to-digital converter for converting the analog radio frequency pulses to a digital magnetic resonance signal with four fold over sampling;
a first finite impulse response means that negates, zeroes, and rebins the digital magnetic resonance signal for effectively multiplying it by +1, 0, and −1;
a second finite impulse response means that negates, zeroes, and rebins the digital magnetic resonance signal for effectively multiplying it by +1, 0, and −1, the second finite impulse resonance means being 90° out of phase with he first finite impulse resonance means to generate in-phase and quadrature digital magnetic resonance signal components;
a digital image processing means for digitally processing the digital in-phase and quadrature magnetic resonance signal components into an image representation.

10. A magnetic resonance imaging system comprising:
a magnetic field means for creating a main magnetic field and magnetic field gradients through an image region;
a digital transmitter which digitally processes digital input commands to determine, digitally, characteristics of a transmitted radio frequency signal, the digital transmitted including a numerically controlled modulated oscillator which receives digital frequency and phase control signals and a clocking signal;
a first converter means for converting the digitally determined characteristics into analog radio frequency pulses;
an antenna which receives the analog radio frequency pulses and transmits corresponding radio frequency energy into the image region;
a digital receiver for converting an analog resonance signal emanating from the image region to digital data;
a digital image processing means for digitally processing the digital data into an image representation.

11. The system as set forth in claim 10 further including a wave-form memory means which is addressed by the output of the numerically controlled modulated oscillator to translate the digital input data to a waveform of appropriate phase and frequency.

12. The system as set forth in claim 11 further including a multiplying means for multiplying the waveform digitally by a digital amplitude profile such that the resultant wave-form is digitally amplitude modulated.

13. The system as set forth in claim 12 further including a mixer for combining the amplitude modulated wave-form with a carrier frequency; a power amplifier for amplifying the mixed signal and conveying it to the radio frequency coil.

14. A magnetic resonance system comprising:
a transmitted for transmitting radio frequency energy into an examination region to excite and manipulate magnetic resonance;
a digital receiver for receiving magnetic resonance signals emanating from the examination region, the receiver including:
a sampling means for digitizing the received analog resonance signals at a selected sampling rate and
a digital filter for digitally multiplying the digitized resonance signal with in-phase and out-of-phase components of a carrier.

15. The system as set forth in claim 14 further including a second digital receiver, the digital receivers being connected with different resonance signal receiving coils and wherein the second digital receiver includes:
a second sampling means for digitizing the received analog resonance signals and a finite impulse response digital filter means for digitally multiplying the digitized resonance signals with in-phase and out-phase components of the carrier to demodulate and filter the digital data, the digital filter means of each receiver having different coefficients which effect a 90 degree phase shift therebetween.

16. A magnetic resonance imaging system for concurrently imaging at least two nuclei comprising:
a magnetic field means for creating a main magnetic field and magnetic field gradients through an image region;
a common clock generator which generates clock signals;
a first digital transmitter clocked by the common clock generator which digitally processes digital input commands to determine, digitally, characteristics of a first transmitted radio frequency signal;
a second digital transmitter which is clocked by the common clock generator and which determines digitally characteristics of a second transmitted radio signal;
a converter means for converting the digitally determined first and second signal characteristics into analog radio frequency pulses;
an antenna means which receives the analog radio frequency pulses and transmits corresponding radio frequency energy into the image region to excite resonance in the first and second nuclei, such that the first and second digital transmitters excite first and second nuclei, respectively, to resonance;
a first digital receiver clocked by the common clock generator for receiving, digitizing, and digitally demodulating analog resonance signals emanating from the first nuclei into first digital data;
a second digital receiver which is clocked by the common clock generator for receiving, digitizing, and digitally demodulating analog resonance signals emanating from the second nuclei into second digital data;

a digital image processing means for digitally processing the first and second digital data into at least one image representation.

17. A magnetic resonance system comprising:
a transmitter means for transmitting radio frequency energy into an examination region;
a digital receiver including:
   an analog to digital converter for converting a received analog resonance signal to a digital signal,
   a digital demodulating means for digitally multiplying the digital signal by digital sine and cosine values such that the received resonance signal is digitally quadrature baseband demodulated; and,
a digital processing means for digitally processing the digital quadrature baseband demodulated magnetic resonance signal.

18. A magnetic resonance system comprising:
a plurality of digital transmitters for transmitting radio frequency energy into an examination region;
a plurality of digital receivers each including a digital demodulating means for digitally quadrature baseband demodulating received resonance signals;
a digital processing means for digitally processing the digital quadrature baseband demodulated magnetic resonance signals; and
a common clock means for synchronously clocking the plurality of digital transmitters and receivers.

19. A magnetic resonance imaging system comprising:
a digital transmitter which includes:
   a means for providing a digital wave form,
   a digital modulation means for numerically modulating amplitude, phase, and frequency of the digital wave form, and
   a means for converting the numerically modulated digital wave form into an analog radio frequency signal that is transmitted into an examination region to excite and manipulate magnetic resonance;
a receiver for receiving magnetic resonance signals emanating from the examination region; and,
an image processing means for processing the received magnetic resonance signals into an image representation.

20. A magnetic resonance imaging system comprising:
a clocking means for generating clocking signals;
a digital transmitter which includes a digital modulation means for numerically modulating amplitude, phase, and frequency of a radio frequency signal that is transmitted into an examination region to excite and manipulate magnetic resonance, the digital modulation means being clocked by the clocking signals, the digital transmitter further including a means for interrupting a receipt of clocking signals by the digital modulation means for creating pulses in the transmitted radio frequency signals;
a receiver for receiving magnetic resonance signals emanating from the examination region; and,
an image processing means for processing the received magnetic resonance signals into an image representation.

21. A magnetic resonance system comprising:
a digital transmitter including:
   a digital memory means for storing a digital wave form,
   a digital modulating means for digitally multiplying the digital wave form by a digital word to form a digital pulse profile,
   a means for converting the digital pulse profile into an analog radio frequency signal for transmission into an examination region to excite and manipulate magnetic resonance;
a digital receiver including:
   a digital to analog converter for converting received analog resonance signals emanating from the examination region into digital signals and
   a digital demodulating means for digitally multiplying the digital signals by digital in-phase and out-of-phase components of a carrier frequency;
a digital image processing means for processing the digital magnetic resonance signals into an image representation; and,
a clock means for synchronously clocking the digital transmitter, the digital receiver, and the digital image processing means.

22. A magnetic resonance system comprising:
a digital transmitter for transmitting radio frequency signals into an examination region to excite and manipulate magnetic resonance;
a means for digitizing analog resonance signals emanating from the examination region;
a first digital demodulating means for digitally multiplying the digital signals by digital sine and cosine values of a first carrier frequency to produce first frequency magnetic resonance signals;
a second digital demodulating means for digitally multiplying the digital signals by digital sine and cosine values of a second carrier frequency to produce second frequency magnetic resonance signals;
a digital image processing means for processing the digital first and second frequency magnetic resonance signals into at least one image representation; and,
a clock means for synchronously clocking the digital transmitter, the first and second digital demodulating means, and the digital image processing means.

23. The system as set forth in claim 22 further including a second digital transmitter for transmitting radio frequency signals into the examination region.

* * * * *